United States Patent
LaBella et al.

(10) Patent No.: US 7,405,086 B2
(45) Date of Patent: Jul. 29, 2008

(54) ABOVE ROOM TEMPERATURE FERROMAGNETIC SILICON

(75) Inventors: Vincent Patrick LaBella, Cohoes, NY (US); Martin Bolduc, Albany, NY (US); Chaffra Adeyandju Awo-Affouda, Albany, NY (US); Mengbing Huang, Guilderland, NY (US)

(73) Assignee: The Research Foundation of State University of New York, Albany, NY (US)

( * ) Notice: Subject to any disclaimer, the term of this patent is extended or adjusted under 35 U.S.C. 154(b) by 208 days.

(21) Appl. No.: 11/085,938

(22) Filed: Mar. 22, 2005

(65) Prior Publication Data

US 2006/0213581 A1    Sep. 28, 2006

(51) Int. Cl.
   H01L 21/00    (2006.01)
   H01L 29/82    (2006.01)
(52) U.S. Cl. .................. 438/3; 257/421; 148/239; 428/842.3
(58) Field of Classification Search ............ 438/3, 438/510, 514; 257/421; 148/239; 428/842.3
See application file for complete search history.

(56) References Cited

U.S. PATENT DOCUMENTS

2006/0076592 A1* 4/2006 Salib et al. ............. 257/295

OTHER PUBLICATIONS

Takeuchi et al., "Appearance of Ferromagnetism at Room Temperature in Mn—Si films Prepared by Alternate Deposition", IEEE trans. on Magnetics, vol. 29, No. 6, pp. 3090-3092, Nov. 1993.*

Zhang et al., "Ferromagnetism in Mn-doped silicon", Journal of Magnetism and Magnetic Materials, vol. 282, pp. 216-218, Nov. 2004.*

Overberg et al., "Room Temperature magnetism in GaMnP produced by both ion implatation and molecular-beam epitaxy", J. Vac. Sci. Technol. B20(3), May 2002, pp. 969-973.*

Kim et al., "Growth of Ferromagnetic Semiconducting Si:Mn film by Vacuum Evaporation Method". chem. Mater., vol. 15, No. 21, pp. 3964-3965. 2003.*

Gajdzik et al., "Ferromagnetism above room temperature in Mn—Si—C alloy films", Appl. Phys. Lett. 68 (22) May 1996, pp. 3189-3190.*

Awo-Affouda, et al., Achievement of Ferromagnetism in Silicon through Mn Ion Implantation, The American Physical Society, www.aps.org/meet/MAR04/baps/abs/G270009.html, Jan. 2004 (1 page).

Kim, et al., Growth of Ferromagnetic Semiconducting Si:Mn Film by Vacuum Evaporation Method, American Chemical Society, *Chem Mater.* 2003, No. 15 (pp. 3964-3965).

(Continued)

*Primary Examiner*—Tuan H Nguyen
(74) *Attorney, Agent, or Firm*—Heslin Rothenberg Farley & Mesiti P.C.; Wayne F. Reinke, Esq.

(57) ABSTRACT

A manganese-implanted silicon substrate exhibits ferromagnetism and a Curie temperature above room temperature when magnetized. The implant is done at a temperature of between about 250 C and about 800 C, while the manganese concentration is between about 0.01 atomic percent and 10 atomic percent. The silicon substrate can be p- or n-type with a doping concentration between $10^{15}$ and $10^{21}$ cm$^{-3}$. Annealing may be done to increase the saturation magnetization.

31 Claims, 4 Drawing Sheets

OTHER PUBLICATIONS

Akinaga, et al., "Magneto-optical properties and the potential application of GaAs with magnetic MnAs nanoclusters," American Institute of Physics, *Appl. Phys. Lett.*, vol. 76, No. 1, 2000 (pp. 97-99).

Gilles, et al., "Impact of the electronic structure on the solubility and diffusion of 3d transition elements in silicon," The American Physical Society, *Physical Review B*, vol. 41, No. 9, 1990 (pp. 5770-5782).

Francois-Saint-Cyr, "Secondary ion mass spectrometry characterization of the diffusion properties of 17 elements implanted into silicon," American Vacuum Society, *J. Vac. Sci. Technol. B*, vol. 19, No. 5, 2001 (pp. 1769-1774).

Dietl, Tomasz, "Ferromagnetic semiconductors," Institute of Physics Publishing, *Semicond. Sci. Technol.*, vol. 17, 2002 (pp. 377-392).

Dietl, et al., "Hole-mediated ferromagnetism in tetrahedrally coordinated semiconductors," The American Physical Society, *Physical Review B*, vol. 63, No. 195205, 2001 (pp. 1-21).

Datta, Supriyo and Das, Biswajit, "Electronic analog of the electrooptic modulator, " American Institute of Physics, *Appl. Phys. Lett.*, vol. 56, No. 7, 1990 (pp. 665-667).

Das Sarma, et al., "Temperature-dependent magnetization in diluted magnetic semiconductors, " The American Physical Society, *Physical Review B*, vol. 67, No. 155201, 2003 (pp. 1-16).

Cho, et al., "Ferromagnetism in Mn-doped Ge," The American Physical Society, *Physical Review B*, vol. 66, No. 033303, 2002 (pp. 1-3).

Chen, et al., "Ferromagnetic properties and structures of the Mn-implanted GaAs semiconductor," American Institute of Physics, *Journal of Applied Physics*, vol. 87, No. 9, 2000 (pp. 5636-5638).

Chen, et al., "Above-room-temperature ferromagnetism in GaSb/Mn digital alloys," American Institute of Physics, *Appl. Phys. Lett.*, vol. 81, No. 3, 2002 9pp. 511-513).

Kirk, et al., "Switching of nanoscale magnetic elements," American Institute of Physics, *Appl. Phys. Lett.*, vol. 75, No. 23, 1999 (pp. 3683-3685).

Malajovich, et al., "Coherent Transfer of Spin through a Semiconductor Heterointerface," The American Physical Society, *Physical Review Letters*, vol. 84, No. 5, 2000 (pp. 1015-1018).

Theodoropoulou, et al., "Use of ion implantation to facilitate the discovery and characterization of ferromagnetic semiconductors," American Institute of Physics, *J. of Appl. Phys.*, vol. 91, No. 10, 2002 (pp. 7499-7501).

Shi, et al., "Magnetic properties and imaging of Mn-implanted GaAs semiconductors," American Institute of Physics, *J. of Appl. Phys.*, vol. 79, No. 8, 1996 (pp. 5296-5298).

Sadana, et al., "Transmission electron microscopy of aluminum implanted and annealed (100) Si: Direct evidence of aluminum precipitate formation," American Institute of Physics, *Appl. Phys. Lett.*, vol. 49, No. 18, 1986 (pp. 1169-1171).

Borzenko, et al., "Very Large Magnetoresistance in Lateral Ferromagnetic (Ga,Mn)As Wires with Nanoconstrictions," The American Physical Society, *Physical Review Letters*, vol. 91, No. 21, 2003 (pp. 216602-1-216602-4).

Park, et al., "Magnetoresistance of Mn:Ge ferromagnetic nanoclusters in a diluted magnetic semiconductor matrix," American Institute of Physics, *Appl. Phys. Lett.*, vol. 78, No. 18, 2001 (pp. 2739-2741).

Park, et al., "Electrical spin injection across air-exposed epitaxially regrown semiconductor interfaces," American Institute of Physics, *Appl. Phys. Lett.*, vol. 77, No. 24, 2000 (pp. 3989-3991).

Overberg, et al., "Room temperature magnetism in GaMnP produced by both ion implantation and molecular-beam epitaxy," American Vacuum Society, *J. Vac. Sci. Technol. B*, vol. 20, No. 3, 2002 (pp. 969-973).

Ohno, et al., "(Ga,Mn)As: A new diluted magnetic semiconductor based on GaAs," American Institute of Physics, *Appl. Phys. Lett.*, vol. 69, No. 3, 1996 (pp. 363-365).

Ohldag, et al., "Magnetic moment of Mn in the ferromagnetic semiconductor $(Ga_{0.98}Mn_{0.02})As$," American Institute of Physics, *Appl. Phys. Lett.*, vol. 76, No. 20, 2000 (pp. 2928-2930).

Theodoropoulou, et al., "Unconventional Carrier-Mediated Ferromagnetism above Room Temperature in Ion-Implanted (Ga, Mn)P:C," The American Physical Society, *Physical Review Letters*, vol. 89, No. 10, 2002 (pp. 107203-1-1072003-4).

Tsui, et al., "Novel Germanium-Based Magnetic Semiconductors," The American Physical Society, *Physical Review Letters*, vol. 91, No. 17, 2003 (pp. 177203-1-172003-4).

Wolf, et al., "Spintronics: A Spin-Based Electronics Vision for the Future," www.sciencemag.org, *Science*, vol. 294, 2001 (pp. 1488-1495).

Wilson, et al., "Range and shape factors, damage, regrowth, and redistribution for Ag implants in (100) and (111) Si," American Institute of Physics, *J. of Appl. Phys.*, vol. 61, No. 4, 1987 (pp. 1355-1358).

Wellman, et al., Formation of nanoscale ferromagnetic MnAs crystallites in low-temperature grown GaAs, American Institute of Physics, *Appl. Phys. Lett.*, vol. 71, No. 17, 1997 (pp. 2532-2534).

Schilfgaarde, et al., "Anomalous exchange interactions in III-V dilute magnetic semiconductors," The American Physical Society, *Physical Review B*, vol. 63 (pp. 233205-1-233205-4).

Woodbury, et al., "Spin Resonance of Transition Metals in Silicon," *Physical Review*, vol. 117, No. 1, 1960 (13 pages).

* cited by examiner

ABOVE ROOM TEMPERATURE FERROMAGNETIC SILICON

GOVERNMENT RIGHTS STATEMENT

This invention was made with U.S. Government support from the National Science Foundation Grant No. DMR-0349108, awarded by the National Science Foundation, and under MARCO/DARPA Interconnect Focus Center Contract No. B-12-M06-03. The U.S. Government has certain rights in the invention.

BACKGROUND OF THE INVENTION

1. Technical Field

The present invention generally relates to ferromagnetic silicon. More particularly, the present invention relates to ferromagnetic silicon with a Curie temperature above room temperature.

2. Background Information

Utilizing the spin of the electron in semiconductor devices holds great potential to provide high-speed device structures. The integration of ferromagnetism into these device structures is needed to couple to electron spin. Diluted magnetic semiconductors (DMS) have been demonstrated as a successful method for integrating ferromagnetism through doping of a semiconductor crystal with an additional transition metal impurity such as manganese (Mn).

Epitaxially grown Group III-V semiconductors such as $Ga_{1-x}Mn_xAs$, have achieved ferromagnetism with Curie temperatures up to 110 K for ($x\approx5\%$) and have been successfully utilized as spin aligners in spin-LED devices. This success has motivated the search for Group-IV-based DMS materials with high Curie temperatures, due to their compatibility with conventional integrated circuits. Recently, an epitaxially grown single crystal of $Mn_xGe_{1-x}$ ($x$—3.5%) achieved a magnetically ordered phase from a long-range ferromagnetic interaction at 116 K, epitaxially grown thin films of $Ce_xSi_{1-x}$ ($x=0.5\%$) produced a material with a magnetic susceptibility that displayed spin glass-like behavior around 40 K, and epitaxially grown $Mn_xSi_{1-x}$ ($x=5\%$) thin films produced a material with an anomalous Hall effect (due to internal magnetization) around 70 K. These findings are also supported by theoretical calculations that have predicted ferromagnetic ordering in Group-IV semiconductors.

Ion implantation has also been utilized to achieve ferromagnetism in semiconductor crystals, and it is an attractive technique, since it is routinely used in the manufacturing of integrated circuits. For example, three atomic percent Mn-implanted GaN and GaP achieved Curie temperatures of 270 and 250 K, respectively. Furthermore, ion implantation is attractive for a silicon-based DMS, since Mn concentrations of about one atomic percent ($\sim 10^{20}$ cm$^{-3}$ for Si) would be needed, exceeding the solubility limit of Mn in Si ($\sim 10^{16}$ cm$^{-3}$ at 1000 degrees Celsius).

Somewhat surprisingly, the fabrication of a silicon-based DMS via ion implantation of manganese has not been reported. Only recently, have the structural properties of Mn-ion implantation into Si been studied. Missing from both the epitaxially grown (Mn, Ce)-doped silicon thin-film studies and the Mn-ion implantation into Si studies is a direct measure of ferromagnetic properties and their dependence upon temperature.

Thus, a need exists for a diluted magnetic semiconductor that is easily incorporated into modern semiconductor production and useful in applications at and above room temperature.

SUMMARY OF THE INVENTION

Briefly, the present invention satisfies the need for a diluted magnetic semiconductor useful in modern production by providing ferromagnetic manganese silicon that can be used in applications at and above room temperature.

In accordance with the above, it is an object of the present invention to provide ferromagnetic silicon.

It is still another object of the present invention to provide a method of making ferromagnetic silicon.

It is another object of the present invention to provide ferromagnetic silicon useful in modern semiconductor production.

The present invention provides, in a first aspect, a composition, comprising silicon and manganese. When exposed to a magnetic field, the composition exhibits ferromagnetism and a Curie temperature above room temperature.

The present invention provides, in a second aspect, a method of making ferromagnetic silicon. The method comprises providing a silicon substrate, and implanting manganese ions into the substrate at a temperature of between about 250 degrees Celsius and about 800 degrees Celsius.

The present invention provides, in a third aspect, a method of making ferromagnetic silicon. The method comprises providing a p- or n-type doped silicon wafer, placing the silicon wafer in an ion implant machine, heating the ion implant machine to a desired implant temperature, and causing the ion implant machine to implant a predetermined dose of manganese ions into the silicon wafer.

These, and other objects, features and advantages of this invention will become apparent from the following detailed description of the various aspects of the invention taken in conjunction with the accompanying drawings.

DETAILED DESCRIPTION OF THE INVENTION

Figure 1:
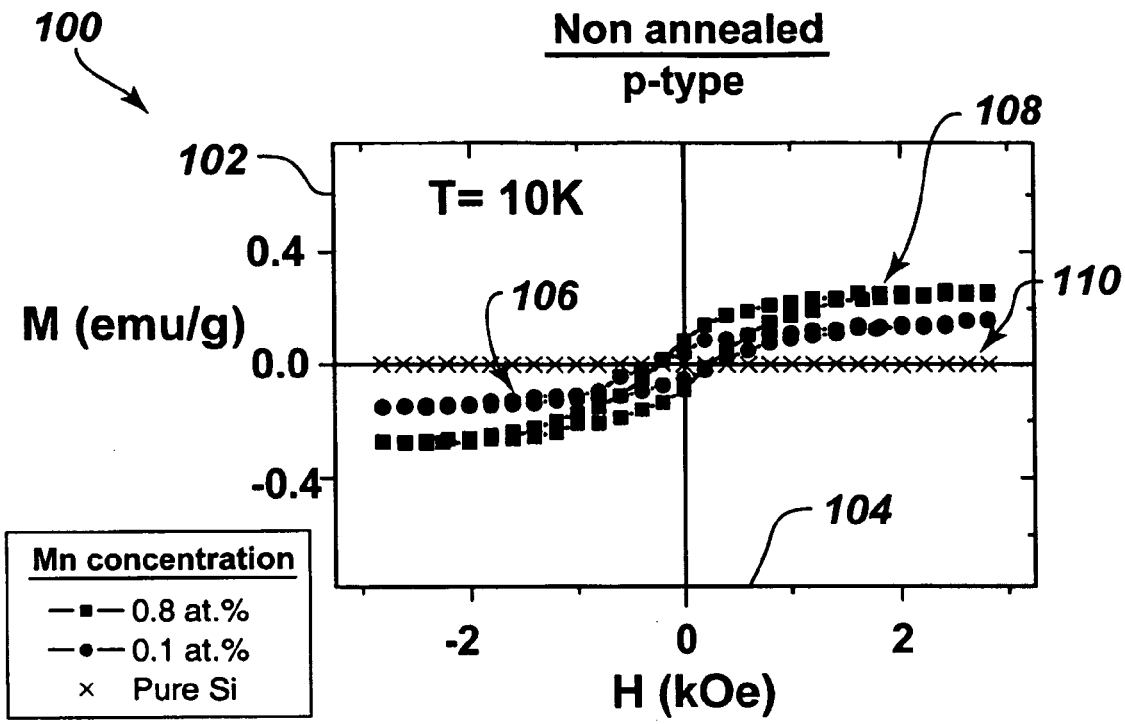
FIG. 1 is a graph of magnetization versus applied magnetic field for a p-type silicon substrate with manganese concentrations of 0.1 atomic percent and 0.8 atomic percent at a temperature of 10 degrees Kelvin.

Above room temperature ferromagnetic behavior is achieved in silicon through manganese ion implantation. $Mn^+$ ions were implanted to 0.1% and 0.8% peak atomic concentrations, yielding a saturation magnetization of 0.3 emu/g at 300 K for the highest concentration. The saturation magnetization increased by ~2× after annealing. The Curie temperature for all samples was found to be greater than 400 K.

Mn-implanted Si samples were prepared from commercially available single-crystal Si wafers (p-type $10^{19}$ cm$^{-3}$ and n-type $10^{15}$ cm$^{-3}$). They were first cleaned in diluted HF for five minutes to remove the native oxide on the surface prior to implantation. The ion implantation was performed at a base pressure of 5×10$^{-6}$ Torr. Mn$^+$ ions were implanted at an energy of 300 keV at doses of 1×10$^{15}$ cm$^{-2}$ and 1×10$^{16}$ cm$^{-2}$. The samples were held at 350° C. during implantation to avoid possible amorphization. Following implantation, rapid thermal annealing was performed on some samples at a temperature of 800° C. for five minutes in a forming gas of N$_2$.

While the particular embodiments described herein use p-type single-crystal silicon wafers doped with 1×10$^{19}$ cm$^{-3}$ boron, it will be understood that other p-type dopants could be used, and similar results are expected with concentrations of anywhere from about 1×10$^{15}$ cm$^{-3}$ to about 1×10$^{21}$ cm$^{-3}$. Likewise, the same concentration range is true for n-type doping. In this case, the Si wafers were doped with phosphorous, though other dopants could be used (e.g., arsenic or antimony). In addition, while the experiments were done with single-crystal silicon, and that is preferred, it is expected that poly(crystalline) silicon could alternatively be used.

It will also be understood that the ion implantation could be done under different conditions. For example, the implant energy could be higher or lower. As one skilled in the art will know, the implant energy positively controls the depth of the implant into the substrate. The depth of the implant desired will depend, for example, on the particular application for the ferromagnetic silicon.

The implants for the data shown in FIGS. 1-5 resulted in manganese concentrations in the silicon of 0.1 atomic percent and 0.8 atomic percent for the p-type wafers, and 0.8 atomic percent for the n-type wafer. However, it will be understood that ferromagnetism is expected at manganese concentrations in a wide range of between about 0.01 atomic percent and about 10 atomic percent.

In addition, although the experimental manganese ion implants were done at a temperature of about 350 degrees Celsius, it will be understood that similar results are expected at implant temperatures ranging from about 250 degrees Celsius to about 800 degrees Celsius.

Finally, while annealing was shown to increase the saturation magnetization, it will be understood that annealing is not required to achieve ferromagnetism in manganese implanted silicon. Furthermore, annealing can be done to achieve a range of possible increase in the saturation magnetization by altering the temperature at which the anneal is done. For example, if just a small increase in the saturation magnetization is desired, one could anneal at much lower temperatures. It is expected that some increase (to varying degrees) in the saturation magnetization will be realized at temperatures between about 200 degrees Celsius and about 900 degrees Celsius.

Further, the amount of time for the anneal does not appear to have any significant effect on the increase in saturation magnetization up to as much as five minutes and likely longer. However, as a practical matter, the machinery used for annealing will require at least about one second for the anneal. It is also expected that flash annealing could instead be used. As one skilled in the art will know, flash annealing is simply an anneal done at a rapid temperature ramping rate, typically on the order of 220 degrees Celsius per second, and cooled at a rapid rate as well, typically as fast as 80 degrees Celsius per second. One example of a commercially available flash annealing tool is a HEATPULSE 410 from AG Associates, San Jose, Calif. In addition, while a forming gas of N$_2$ was used for the experimental anneals, it will be understood that any inert gas could be used.

Measurements of magnetization versus applied field at 10, 77, and 300 K were performed using a commercially available Superconducting Quantum Interference Device (SQUID) magnetometer, which had a temperature range from 10 to 400 K. One example of a commercially available SQUID magnetometer is an MPMS from Quantum Design, San Diego, Calif. To determine Curie temperature ($T_c$), the remnant field was measured under a zero applied field after cooling the sample from room temperature. As one skilled in the art will know, the Curie temperature is the temperature above which a ferromagnetic material loses its permanent magnetism. The structural composition was investigated by means of Dynamic Secondary Ion Mass Spectroscopy (SIMS) depth profiling. One example of a commercially available SIMS profiler is a PHI 6300 Quadropole SIMS from Perkin-Elmer, Wellesley, Mass.

The measured profiles had a Gaussian shape peaking at 260 nm with a fall-width half-maximum (FWHM) of 120 nm in good agreement with Monte Carlo software simulations. The Mn concentration was taken to be the peak concentration value, as measured from the SIMS data. The SIMS depth profiles were calibrated by measuring the crater depth using a stylus profilometer. No detectable contaminant, such as iron, was found in either nonannealed or annealed implanted Si wafers, as determined by x-ray photoelectron spectroscopy (XPS) and Rutherford back scattering (RBS). Finally, Hall effect measurements on the initial p-type doped samples did not show a significant change in carrier concentration after Mn implantation. The results of the experiments, shown graphically in FIGS. 1-5 will now be discussed in detail.

FIG. 1 is a graph 100 of magnetization 102 versus applied magnetic field 104 (also known as, magnetization curves or hysteresis loops) for p-type silicon substrates with manganese concentrations of 0.1 atomic percent 106 and 0.8 atomic percent 108 at a temperature of 10 degrees Kelvin. Also shown in FIG. 1 is the p-type silicon substrates prior to ion implantation (110), confirming the lack of impurities that may cause some degree of ferromagnetism at low temperatures. The linear background diamagnetic behavior of the Si was subtracted for all the displayed data in FIGS. 1-5. The non-Mn-implanted Si, both before and after annealing, showed no net magnetic moment, whereas the saturation magnetization increases with Mn concentration. FIG. 1 also shows that annealing is not required for manganese implanted silicon to exhibit ferromagnetism.

Figure 2:
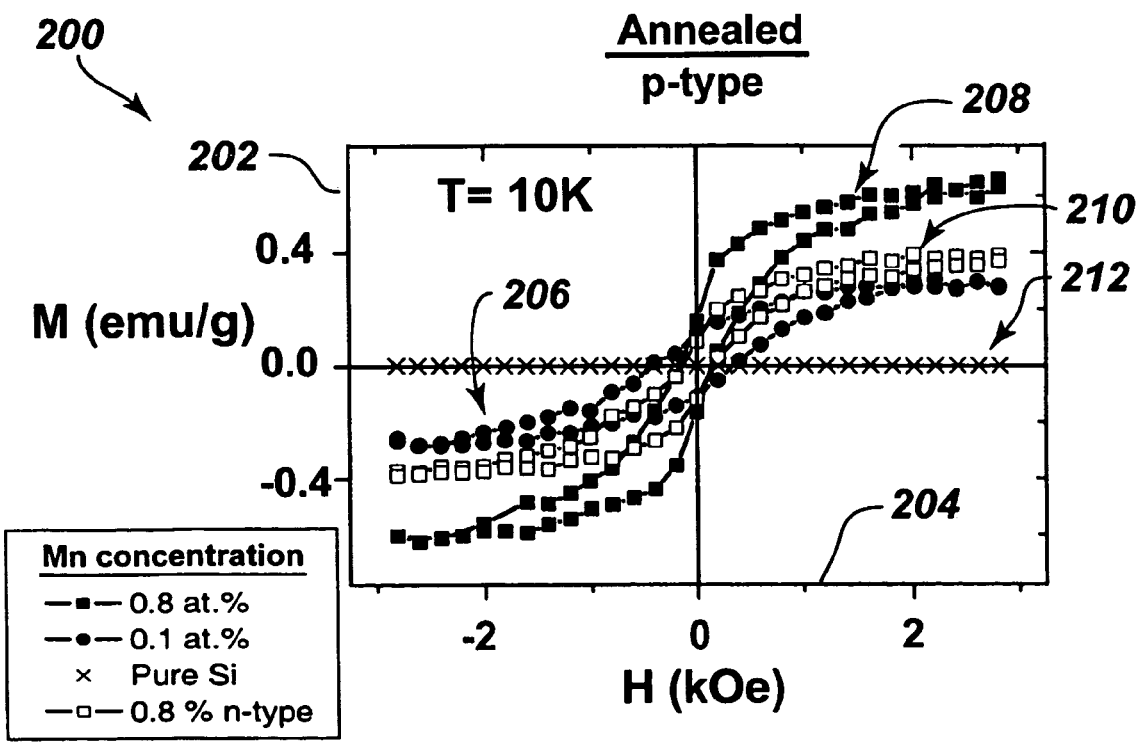
FIG. 2 is a graph of magnetization versus applied magnetic field for annealed p-type and n-type silicon substrates with manganese concentrations of 0.1 and 0.8 atomic percent for p-type and 0.8 atomic percent for n-type, at a temperature of 10 degrees Kelvin.

FIG. 2 is a graph 200 of magnetization 202 versus applied magnetic field 204 for annealed p-type and n-type silicon substrates. The substrates had manganese concentrations of 0.1 atomic percent (206) and 0.8 atomic percent (208) for the p-type, and 0.8 atomic percent (210) for the n-type, all at a temperature of 10 degrees Kelvin. Like FIG. 1, FIG. 2 also shows the substrates prior to manganese ion implantation (212). As shown in FIG. 2, annealing increases the saturation magnetization by ~2×, though the saturation magnetization is weaker for the implanted n-type Si. The coercive field is ~250 Oe for all samples. The mass of each sample was calculated by taking the FWHM of the SIMS profile.

Figure 3:
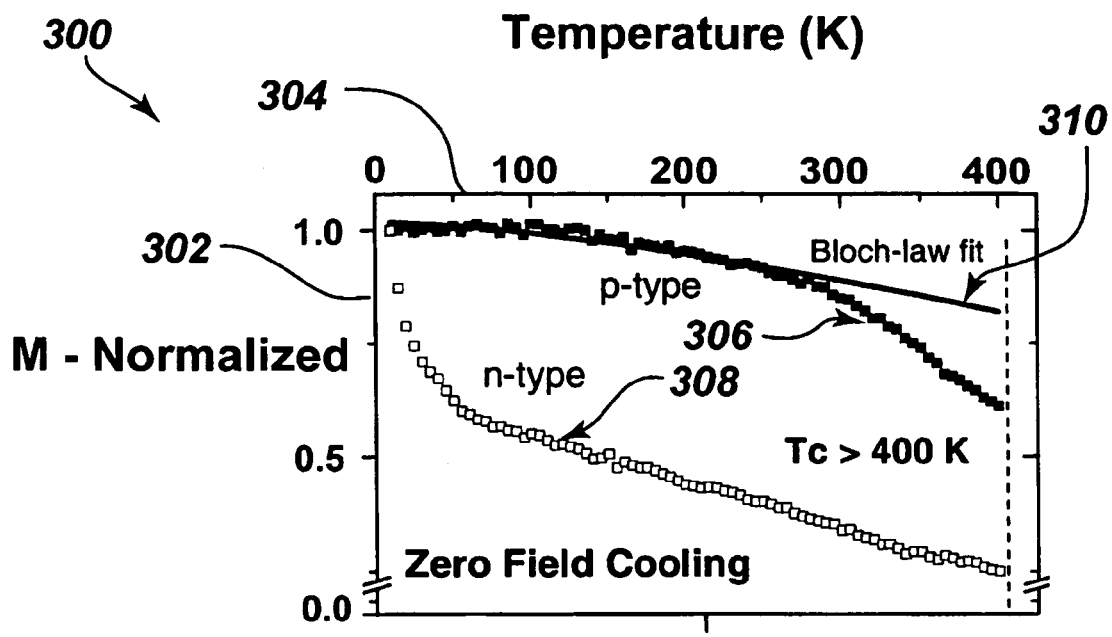
FIG. 3 is a graph of normalized remnant magnetization versus temperature after cooling the sample under zero applied magnetic field.

FIG. 3 is a graph 300 of the normalized temperature-dependent remnant magnetization [$M_r/M_r$ (10 K)] 302 versus temperature 304. Shown are plots for 0.8 atomic percent Mn-ion implanted p-type (306) and n-type (308) single-crystal silicon between 10 and 400 K under zero applied magnetic field. The samples were zero-field cooled from room temperature to 10 K prior to the magnetization measurements.

The normalized data for all the p-type doped samples displayed similar temperature-dependent behavior; hence, only the 0.8 atomic percent Mn-implanted samples are displayed. Ferromagnetic order from 10 to 400 K is observed with the magnetization decreasing from a peak at 10 K to approximately 60% of its initial value at 400 K. A Bloch law dependence 310 ($M \propto T^{(3/2)}$) is fit to the data over the temperature range <200 K with a 90% confidence. For the n-type sample, an initial rapid decrease of the magnetization with temperature is followed by a much slower decay at temperatures above 50 K, finally reaching approximately 40% of its initial value at 400 K.

Figure 4:
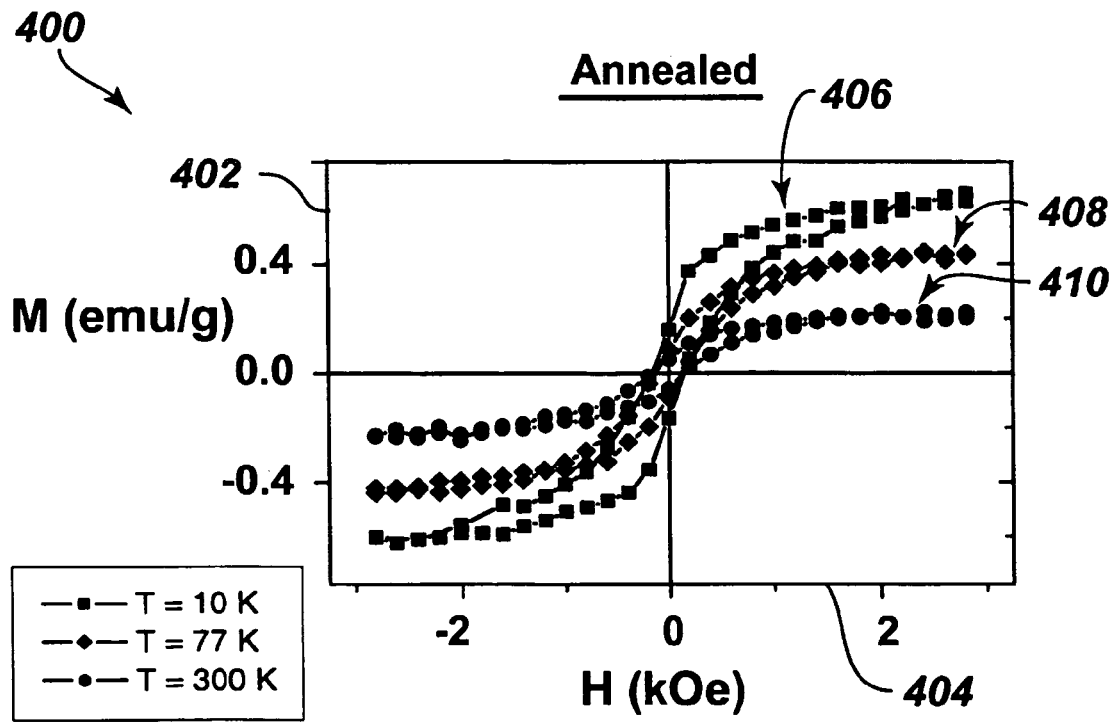
FIG. 4 is a graph of magnetization versus applied magnetic field for an annealed p-type silicon substrate with a manganese concentration of 0.8 atomic percent at temperatures of 10, 77 and 300 degrees Kelvin.
Figure 5:
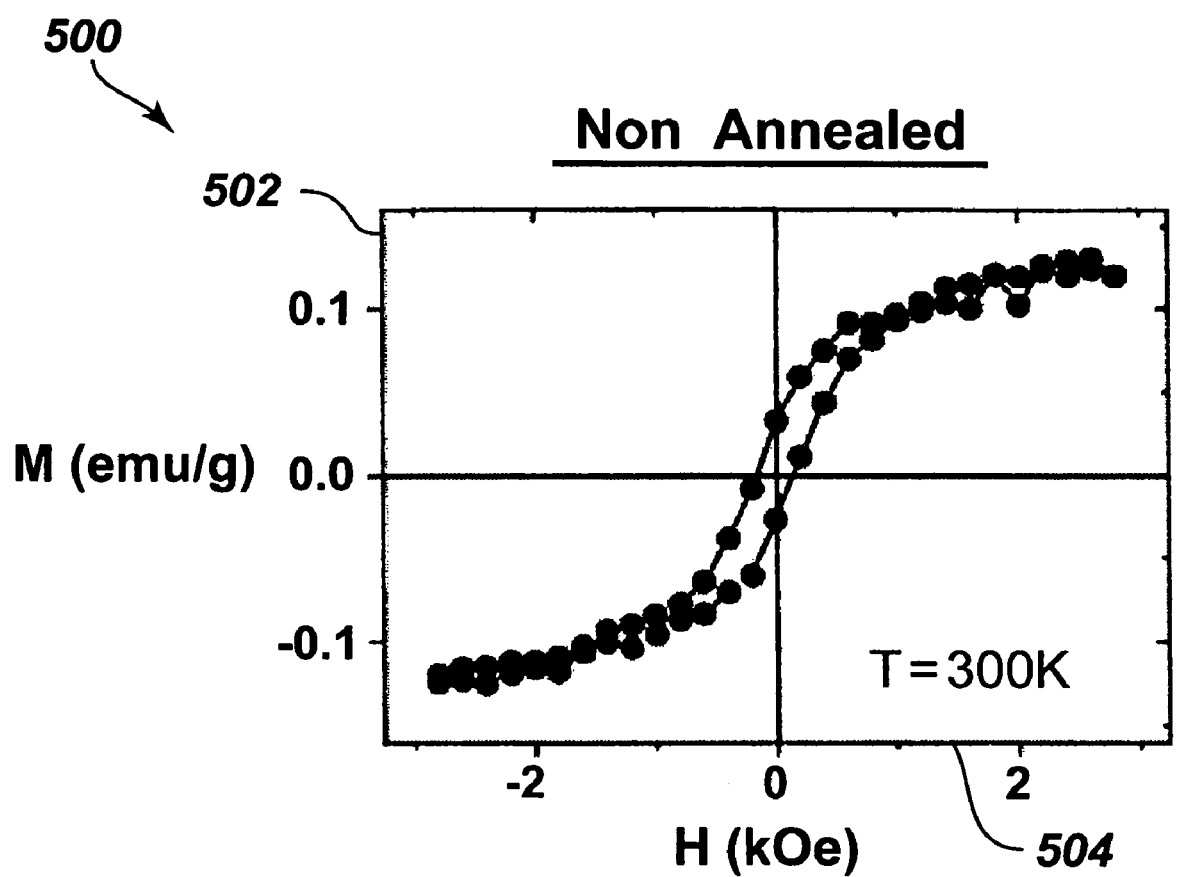
FIG. 5 is a graph of magnetization versus applied magnetic field for a non-annealed p-type silicon substrate with a manganese concentration of 0.8 atomic percent at a temperature of 300 degrees Kelvin.

FIG. 4 is a graph 400 of magnetization 402 versus applied magnetic field 404 for an annealed p-type silicon substrate with a manganese concentration of 0.8 atomic percent at temperatures of 10 K (406), 77 K (408) and 300 K (410). Similarly, FIG. 5 is a graph 500 of magnetization 502 versus applied magnetic field 504 for the p-type substrate with 0.8 atomic percent Mn concentration at 300 degrees Kelvin prior to annealing.

Similar to other Mn-doped semiconductors, the Mn-implanted Si crystals show ferromagnetic ordering. Ferromagnetic ordering in a diluted magnetic semiconductor arises from the long-range ferromagnetic coupling of the magnetic moments of the sparsely distributed Mn impurities, which overcomes the short-range antiferromagnetic exchange that occurs in bulk Mn. The long-range exchange coupling is also hole mediated, and therefore sensitive to the carrier type and carrier concentration. This hole-mediated exchange is demonstrated by the n-type sample having weaker saturation magnetization than the p-type, as displayed in FIG. 2. The strength of the saturation magnetization increased ~2× after annealing, from 0.3 to 0.6 emu/g for the 0.8 atomic percent manganese concentration. Annealing heals the damage in the crystal that arises from the implantation process, possibly increasing the strength of the hole-mediated exchange coupling.

Most striking is the observation of ferromagnetic ordering well beyond room temperature, indicating that the Curie temperature is greater that 400 K. The behavior was not observed in the tests to be affected by the Mn concentration or thermal annealing. In contrast, it has been determined that the Curie temperature varies with Mn concentration in other DMS systems. However, since $T_c$ is typically assigned to the inflection point, which is beyond the temperature limit of the magnetometer, we can only speculate that the $T_c$ remains unchanged across other samples. Below 200 K, the magnetization does not show any distinct transition for the p-type samples, indicating a stable and fully persistent ferromagnetic state as observed by the Bloch law dependence. In contrast, the n-type material exhibits an atypical magnetization curve usually found in weakly coupled systems. This behavior further suggests that the ferromagnetic exchange coupling is hole mediated, and is consistent with other DMS systems and theoretical treatments.

Of great concern when measuring magnetic properties of implanted semiconductors is the presence of second phases or crystallites and their effect upon the magnetic properties. These second phases or crystallites can give rise to superparamagnetic behavior where a blocking temperature is observed below which the magnetization vanishes in zero-field cooled magnetic measurements. The temperature-dependent ferromagnetic behavior of the manganese implanted silicon herein was not found to have a blocking temperature, and full saturation hysteresis loops were obtained at 10, 77, and 300 K (see FIG. 4).

Figure 6:
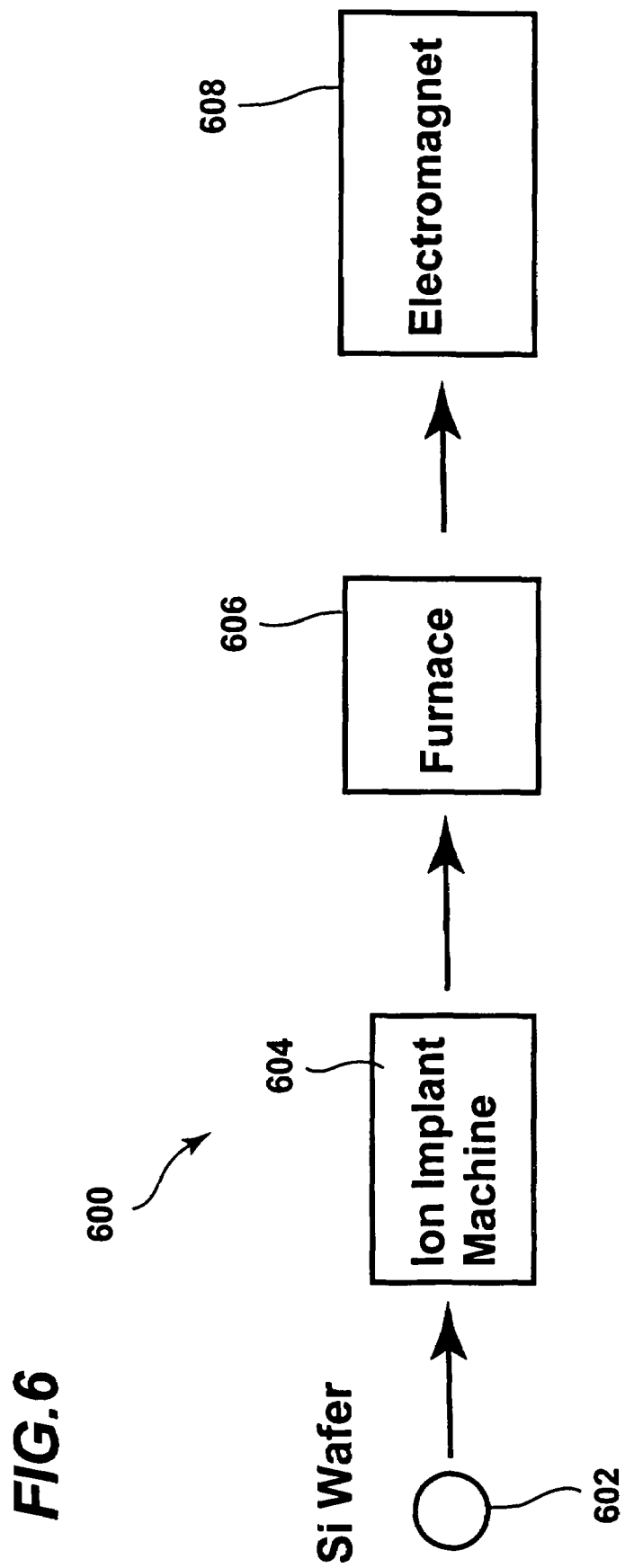
FIG. 6 is a block diagram of a semiconductor fabrication line useful with the present invention.

FIG. 6 is a block diagram 600 of a semiconductor fabrication line useful with the present invention. The line includes a p- or n-doped silicon wafer (e.g., single-crystal silicon) 602, a medium current ion implantation machine 604 prepared to implant manganese ions, furnace 606 for annealing, and electromagnet 608 for magnetizing. One example of a commercially available ion implant machine is an Eaton NV4206 from Eaton Corp., Beverly, Mass. One example of a commercially available furnace is model PEO601 from ATV Technologie GmbH, Vaterstetten, Germany. Finally, one example of an electromagnet is dipole electromagnet model 5414 from GMW Associates, San Carlos, Calif.

Prior to placement in ion implanter 604, silicon wafer 602 is cleaned to remove any native oxide present on the surface. As noted above, for example, this can be done with diluted HF for five minutes, as is known in the art. After placing the wafer in the ion implanter, the implanter is heated to the desired implant temperature, for example, 350 degrees Celsius. The chosen dose of ions is then applied at the desired pressure and energy. As one skilled in the art will know, the dose is measured by multiplying the fluence (atoms/time) by the length of time for the implant. In the present example, a plasma arc source integrated in the implanter was used to supply the manganese ions. As one example, a dose of $1 \times 10^{15}$ cm$^{-2}$ Mn$^+$ ions could be implanted at a pressure of $5 \times 10^{-6}$ Torr and an energy of 300 keV.

Optionally, the implanted wafer can be annealed to increase the saturation magnetization. In the present example, this is done by placing the wafer into furnace 606 for a chosen time and temperature, and with a chosen forming gas. For example, the anneal could be done at 800 degrees Celsius for five minutes using $N_2$.

Also optionally, the wafer (with or without annealing) 602, can be magnetized to "activate" the ferromagnetism. It may desirable, for example, to allow magnetization at a later time, if it is not yet known what the final application will be. In the present example, electromagnet 608 can be used to magnetize the wafer. A magnetic field intensity and a length of time are chosen. For example, a field of 0.5 Tesla for one minute could be used to initiate ferromagnetism.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A composition, comprising silicon and randomly distributed manganese, wherein when exposed to a magnetic field the composition exhibits ferromagnetism and a Curie temperature above room temperature, and wherein a concentration of the manganese in the silicon is between about 0.01 atomic percent and about 10 atomic percent.

2. The composition of claim 1, wherein the Curie temperature is above about 350 degrees Kelvin.

3. The composition of claim 2, wherein the Curie temperature is above about 400 degrees Kelvin.

4. The composition of claim 1, wherein the concentration of manganese is between above 1 atomic percent and about 10 atomic percent.

5. The composition of claim 1, further comprising a p-type dopant in a concentration of between about $1 \times 10^{15}$ cm$^{-3}$ and about $1 \times 10^{21}$ cm$^{-3}$.

6. The composition of claim 1, further comprising a n-type dopant in a concentration of between about $1 \times 10^{15}$ cm$^{-3}$ and about $1 \times 10^{21}$ cm$^{-3}$.

7. The composition of claim 1, wherein the composition exhibits ferromagnetism and a Curie temperature above room temperature.

8. The composition of claim 1, wherein the silicon comprises single-crystal silicon.

9. The composition of claim 1, wherein the silicon comprises poly(crystalline) silicon.

10. The composition of claim 1, wherein the concentration of manganese is between about 0.01 atomic percent and below about 1 atomic percent.

11. A method of making ferromagnetic silicon, comprising:
providing a silicon substrate; and
implanting manganese ions into the substrate at a concentration of between about 0.01 atomic percent and less than 7 atomic percent and a temperature of between about 250 degrees Celsius and about 800 degrees Celsius.

12. The method of claim 11, wherein the temperature is between about 250 degrees Celsius and about 500 degrees Celsius.

13. The method of claim 12, wherein the temperature is between about 300 degrees Celsius and about 400 degrees Celsius.

14. The method of claim 11, further comprising annealing after the implanting.

15. The method of claim 14, wherein the annealing comprises flash annealing.

16. The method of claim 14, wherein the annealing is done at an anneal temperature between about 200 degrees Celsius and about 900 degrees Celsius.

17. The method of claim 16, wherein the annealing is performed for a length of time of at least about 1 second.

18. The method of claim 17, wherein the length of time comprises between about 10 seconds and about 300 seconds.

19. The method of claim 16, wherein the anneal temperature is about 800 degrees Celsius.

20. The method of claim 11, further comprising doping the substrate with a p-type dopant to achieve a dopant concentration of between about $1\times10^{15}$ cm$^{-3}$ and about $1\times10^{21}$ cm$^{-3}$.

21. The method of claim 11, further comprising doping the substrate with a n-type dopant to achieve a dopant concentration of between about $1\times10^{15}$ cm$^{-3}$ and about $1\times10^{21}$ cm$^{-3}$.

22. The method of claim 11, further comprising exposing the substrate to a magnetic field after the implanting, thereby creating ferromagnetic silicon.

23. The method of claim 11, wherein the concentration is between about 0.01 atomic percent and about 1 atomic percent.

24. The method of claim 11, wherein the concentration is between above 1 atomic percent and less than 7 atomic percent.

25. The method of claim 11, wherein the providing comprises providing a single-crystal silicon substrate.

26. The method of claim 11, wherein the providing comprises a poly(crystalline) silicon substrate.

27. A method of making ferromagnetic silicon, comprising:
providing a p- or n-type doped silicon wafer;
placing the silicon wafer in an ion implant machine;
heating the ion implant machine to a desired implant temperature; and
causing the ion implant machine to implant manganese ions into the silicon wafer at a concentration of between about 0.01 atomic percent and less than 7 atomic percent.

28. The method of claim 27, further comprising placing the manganese-implanted silicon wafer into a furnace at a predetermined temperature for a predetermined time.

29. The method of claim 27, further comprising magnetizing the manganese-implanted silicon wafer.

30. The method of claim 29, wherein the magnetizing is accomplished by placing the manganese-implanted silicon wafer in a magnetic field with a predetermined magnetic field intensity for a predetermined amount of time.

31. The method of claim 27, wherein the concentration is between about 0.01 atomic percent and below about 1 atomic percent.

* * * * *